United States Patent [19]
Booth et al.

[11] Patent Number: 5,867,524
[45] Date of Patent: *Feb. 2, 1999

[54] SPREAD SPECTRUM CLOCK GENERATOR AND ASSOCIATED METHOD

[75] Inventors: James Ronald Booth, Nicholasville; Donald Reid Bush, Winchester; John Thomas Fessler, Lexington; Keith Bryan Hardin, Lexington, all of Ky.

[73] Assignee: Lexmark International Inc., Lexington, Ky.

[ * ] Notice: The term of this patent shall not extend beyond the expiration date of Pat. No. 5,488,627.

[21] Appl. No.: 800,890

[22] Filed: Feb. 13, 1997

Related U.S. Application Data

[63] Continuation of Ser. No. 160,077, Dec. 2, 1993, Pat. No. 5,488,627, and a continuation of Ser. No. 425,832, Apr. 20, 1995, Pat. No. 5,631,920.

[51] Int. Cl.$^6$ .................................................. H04B 15/00
[52] U.S. Cl. ......................... 375/200; 375/200; 375/204; 375/376
[58] Field of Search .................................... 375/376, 200, 375/204, 261, 346; 331/25, 36 C, 78

[56] References Cited

U.S. PATENT DOCUMENTS

| | | | |
|---|---|---|---|
| 2,352,254 | 6/1944 | Curtis | 179/78 |
| 2,671,896 | 12/1954 | DeRosa | 342/168 |
| 2,953,780 | 4/1960 | Goldfischer | 342/168 |
| 3,354,410 | 11/1967 | Beuscher | 332/18 |
| 3,388,349 | 6/1968 | Ault | 332/18 |
| 3,764,933 | 10/1973 | Fletcher et al. | 331/1 A |
| 3,878,527 | 4/1975 | Rensin et al. | 375/200 X |
| 3,962,653 | 6/1976 | Basset | 331/2 |
| 4,009,450 | 2/1977 | Holcomb et al. | |
| 4,507,796 | 3/1985 | Stumfall | 375/576 |
| 4,578,649 | 3/1986 | Shupe | 331/78 |
| 4,585,997 | 4/1986 | Lin | |

(List continued on next page.)

FOREIGN PATENT DOCUMENTS

| | | |
|---|---|---|
| 0 163 313 | 4/1985 | European Pat. Off. . |
| 67 1928 | 1/1966 | France . |
| 3-265014 | 11/1991 | Japan . |
| 1090760 | 11/1967 | United Kingdom . |
| 2 128 828 | 5/1984 | United Kingdom . |
| WO90/14710 | 11/1990 | WIPO . |
| WO 82/00930 | 3/1992 | WIPO . |

OTHER PUBLICATIONS

EPO Search Report; Application No. EP 94 30 8802; 3/17/95.

Lin et al., *Reduction of Power Supply EMI Emission by Switching Frequency Modulation*, Virginia ower Electronics Center the VPEC Tenth Annual Power Electronics Seminar, pp. 129–136, Sep. 20–22, 1992.

Habetler et al., *Acoustic Noise Reduction in Sinusoidal PWM Drives Using a Randomly Modulated Carrier*, IEEE Transactions on Power Electronics, Vol. 6, No.s 3, Jul. 1991.

(List continued on next page.)

*Primary Examiner*—Stephen Chin
*Assistant Examiner*—Shu-Wang Liu
*Attorney, Agent, or Firm*—John A. Brady

[57] ABSTRACT

A clock circuit includes an oscillator for generating a reference frequency signal, and a spread spectrum clock generator cooperating with the oscillator for generating a spread spectrum clock output signal having a fundamental frequency and reduced amplitude EMI spectral components at harmonics of the fundamental frequency. The spread spectrum clock generator preferably includes a clock pulse generator for generating a series of clock pulses, and a spread spectrum modulator for frequency modulating the clock pulse generator to broaden and flatten amplitudes of EMI spectral components which would otherwise be produced by the clock pulse generator. The spread spectrum modulator frequency modulates the clock pulses with specific profiles of frequency deviation versus the period of the profile. Electronic devices including the spread spectrum clock circuit and associated method are also disclosed.

4 Claims, 7 Drawing Sheets

U.S. PATENT DOCUMENTS

| | | |
|---|---|---|
| 4,695,808 | 9/1987 | Cabaniss et al. ............................ 331/57 |
| 4,737,968 | 4/1988 | Norton et al. . |
| 4,943,786 | 7/1990 | Cordwell et al. ......................... 331/1 A |
| 4,996,684 | 2/1991 | Morley et al. ........................ 370/100.1 |
| 5,028,887 | 7/1991 | Gilmore ..................................... 331/18 |
| 5,036,298 | 7/1991 | Bulzachelli . |
| 5,095,288 | 3/1992 | Dent . |
| 5,144,260 | 9/1992 | Stribling et al. . |
| 5,148,447 | 9/1992 | Ito . |
| 5,216,713 | 6/1993 | Lindholm . |
| 5,249,199 | 9/1993 | Mayer et al. . |
| 5,263,055 | 11/1993 | Cahill ..................................... 375/346 |
| 5,272,454 | 12/1993 | Ikai et al. ............................... 332/117 |
| 5,301,367 | 4/1994 | Heinonen ................................. 455/76 |
| 5,329,253 | 7/1994 | Ichihara ..................................... 331/17 |
| 5,416,434 | 5/1995 | Kootstra et al. .................... 327/164 X |
| 5,488,627 | 1/1996 | Hardin et al. ........................... 375/204 |
| 5,491,458 | 2/1996 | McCune, Jr. et al. .................. 332/144 |
| 5,659,587 | 8/1997 | Knierim ................................. 375/376 |

OTHER PUBLICATIONS

Tanaka et al., *Random–Switching Control in DC–to–DC Converters*, IEEE, pp. 500–507 (1989).

Commission Electrotechnique Internationale (Comite International Special Des Perturbations Radioelectriques, *C.I.S.P.R. Specification for Radio Interference Measuring Apparatus and Measurement Methods*, Publication 16, First Edition, 1977.

SPREAD SPECTRUM CLOCK GENERATOR AND ASSOCIATED METHOD

RELATED APPLICATIONS

This application is a continuation of U.S. patent application Ser. No. 08/160,077 which was filed on Dec. 02, 1993 and which issued on Jan. 30, 1996 as U.S. Pat. No. 5,488,627, and a continuation of U.S. Pat. application Ser. No. 08/425,832 which was filed on Apr. 20, 1995, now U.S. Pat. No. 5,631,920.

FIELD OF THE INVENTION

This invention relates to the field of digital circuits, and more particularly, to a clock circuit having reduced measurable electromagnetic interference (EMI) emissions.

BACKGROUND OF THE INVENTION

Many electronic devices employ microprocessors or other digital circuits which require one or more clock signals for synchronization. A clock signal permits the precise timing of events in the microprocessor, for example. Typical microprocessors may be supervised or synchronized by a free-running oscillator, such as driven by a crystal, an LC-tuned circuit, or an external clock source. Clocking rates up to and beyond 40 MHz are common in personal computers. The parameters of a clock signal are typically specified for a microprocessor and may include minimum and maximum allowable clock frequencies, tolerances on the high and low voltage levels, maximum rise and fall times on the waveform edges, pulse-width tolerance if the waveform is not a square wave, and the timing relationship between clock phases if two-clock phase signals are needed. (See Electronics Engineers' Handbook, by Fink et al., p. 8–111, 1989.)

Unfortunately, high performance, microprocessor-based devices using leading edge, high speed circuits are particularly susceptible to generating and radiating electromagnetic interference (EMI). The spectral components of the EMI emissions typically have peak amplitudes at harmonics of the fundamental frequency of the clock circuit. Accordingly, many regulatory agencies, such as the FCC in the United States, have established testing procedures and maximum allowable emissions for such products. For example, the Commission Electrotechnique Internationale (Comite International Special Des Perturbations Radioelectriques (C.I.S.P.R.)) has guidelines establishing measurement equipment and techniques for determining compliance with regulations. More particularly, for the frequency band of interest to clock circuits, the measured 6 dB bandwidth is a relatively wide 120 KHz.

In order to comply with such government limits on EMI emissions, costly suppression measures or extensive shielding may be required. Other approaches for reducing EMI include careful routing of signal traces on printed circuit boards to minimize loops and other potentially radiating structures. Unfortunately, such an approach often leads to more expensive multilayer circuit boards with internal ground planes. In addition, greater engineering effort must go into reducing EMI emissions. The difficulties caused by EMI emissions are made worse at higher processor and clock speeds.

Power switching circuits also tend to generate EMI emissions due to the rapid switching of high currents and high voltages. EMI noise reduction in such circuits is generally achieved by suppression of the noise source, isolation of the noise coupling path, and filtering or shielding as reported, for example, in *Reduction of Power Supply EMI Emission by Switching Frequency Modulation*, Lin et al., Virginia Power Electronics Center the VPEC Tenth Annual Power Electronics Seminar, pp. 129–136, Sep. 20–22, 1992. The article further discloses that it is possible to modify the EMI spectrum of the switching power supply circuit to pass regulatory tests by modulating the switching frequency so that side-bands are created thereby smearing the emission spectrum.

In particular the Lin et al. article discloses a switching frequency of 90 KHz that is frequency modulated with a simple sine wave at 400 Hz with the frequency variation selected to be 15 KHz. Improvement of emissions at 90 KHz was reported, which is important because the fundamental frequency EMI determines the amplitude of a required EMI filter for the switching circuit. The article further discloses that from the EMI point of view, a larger frequency variation may be selected and, since there are sideband harmonic frequencies created by the simple sine wave frequency modulation, it is necessary for the switching circuit that these side-bands do not fall within the audible range.

The regulatory requirements for switching power supply circuits fall within a different regulatory category than clock circuits. In particular, as specified by C.I.S.P.R., such switching circuits are only measured for a relatively small 6 dB bandwidth of 9 KHz. Accordingly, approaches described for compliance with such a regulatory test for such a small bandwidth are not adequate to address the difficulties associated with reducing EMI components for high speed digital circuits operating in the tens of megahertz range. The problem associated with lowering measurable EMI emissions is especially difficult where the measured bandwidth is relatively large, such as 120 KHz as in the C.I.S.P.R. regulations which pertain to emissions as generated at typical clock frequencies.

SUMMARY OF THE INVENTION

In view of the foregoing background, it is therefore an object of the present invention to provide a clock circuit and associated method for generating a clock signal, such as for driving a microprocessor or other digital circuit at relatively high frequencies, while reducing the spectral amplitude of EMI components as measured over a relatively large bandwidth.

This and other objects, features, and advantages of the present invention are provided by a clock circuit including an oscillator for generating a reference frequency signal, and spread spectrum clock generating means for generating a spread spectrum clock output signal having a fundamental or center frequency and reduced amplitude EMI spectral components at harmonics of the fundamental frequency. More particularly, the spread spectrum clock generating means preferably includes clock pulse generating means for generating a series of clock pulses, and spread spectrum modulating means for modulating the clock pulse generating means to broaden and flatten amplitudes of EMI spectral components which would otherwise be produced by the clock pulse generating means.

The clock pulse generating means, if unmodulated, would typically produce generally rectangular or trapezoidal electrical pulses which, in turn, would generate corresponding impulse-shaped EMI spectral components at harmonics of the fundamental frequency. The spread spectrum modulating means reduces the peak amplitude of the EMI spectral components that would otherwise be produced. Accordingly, expensive shielding or other EMI suppression techniques may be reduced or eliminated in an electronic device including the spread spectrum clock generating circuit of the present invention. As would be readily understood by those skilled in the art, the spread spectrum clock generating circuit may find wide application in a number of electronic devices, particularly those including a microprocessor or microcontroller, such as a personal computer.

The spread spectrum modulating means preferably includes frequency modulating means for frequency modulating the clock pulse generating means. The frequency modulating means, in turn, preferably includes profile modulating means for frequency modulating the clock pulse generating means with a periodic waveform having a predetermined period and a predetermined frequency deviation profile as a function of the predetermined period. Several preferred or effective ranges for such modulating periodic waveforms are described later herein. In general, the preferred waveforms are more complicated than a simple sine wave in order to thereby reduce the spectral peak of EMI components by broadening and flattening their shape.

The clock pulse generating means preferably includes a phase locked loop as is commonly used in a conventional clock generating circuit. The frequency modulation means may be implemented by several types of circuits including an analog modulating generator or a programmable modulating generator which can produce a predetermined profile for the frequency deviation. In addition, the frequency modulating means is preferably capable of modulating the clock pulse generating means with a periodic waveform having a period of less than about 500 microseconds, that is, the frequency of modulation is desirably greater than about 2 KHz.

A method according to the invention is for generating a clock output signal with reduced amplitude EMI spectral components. The method includes the step of generating a spread spectrum clock output signal having a fundamental frequency and reduced amplitude EMI spectral components at harmonics of the fundamental frequency. The step of generating a spread spectrum clock output signal preferably includes the steps of generating a series of clock pulses, and spread spectrum modulating the series of clock pulses to broaden and flatten amplitudes of EMI spectral components which would otherwise be produced along with the series of clock pulses. The step of spread spectrum modulating the series of clock pulses preferably includes the step of frequency modulating the clock pulses with a periodic waveform having a predetermined period and a predetermined frequency deviation profile as a function of the predetermined period.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art. Like numbers refer to like elements throughout.

Figure 1:
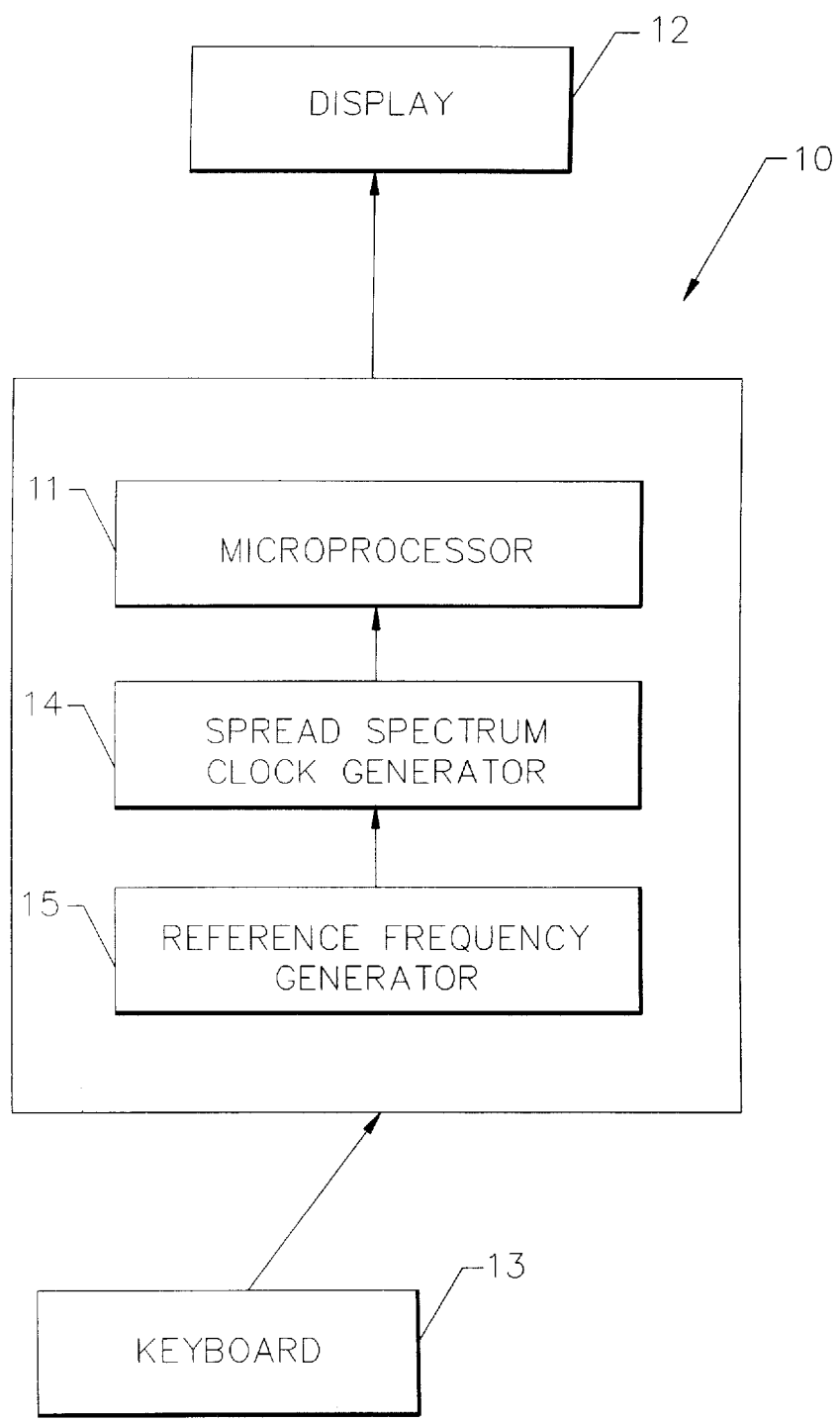
FIG. 1 is a schematic block diagram of a personal computer including a spread spectrum clock generating circuit in accordance with the invention.

Referring first to FIGS. 1 through 5, an electronic device incorporating the spread spectrum clock generating circuit and its basic operation are first explained. As shown in FIG. 1, an electronic device, such as the schematically illustrated personal computer 10, may benefit by having reduced measurable EMI spectral component emissions provided by the spread spectrum clock generator 14 (SSCG) according to the invention. A reference frequency generator 15, such as a piezoelectric crystal driven at its resonant frequency by a suitable driver or oscillator circuit, provides a reference frequency for the SSCG 14. The illustrated personal computer 10 also includes a display 12 and a keyboard 13.

As would be readily understood by those of skill in the art, a number of electronic device incorporating microprocessors or other digital circuits requiring a clock signal for synchronization may also desirably incorporate the SSCG 14. For example, computer printers may also desirably include the SSCG 14.

Figure 2:
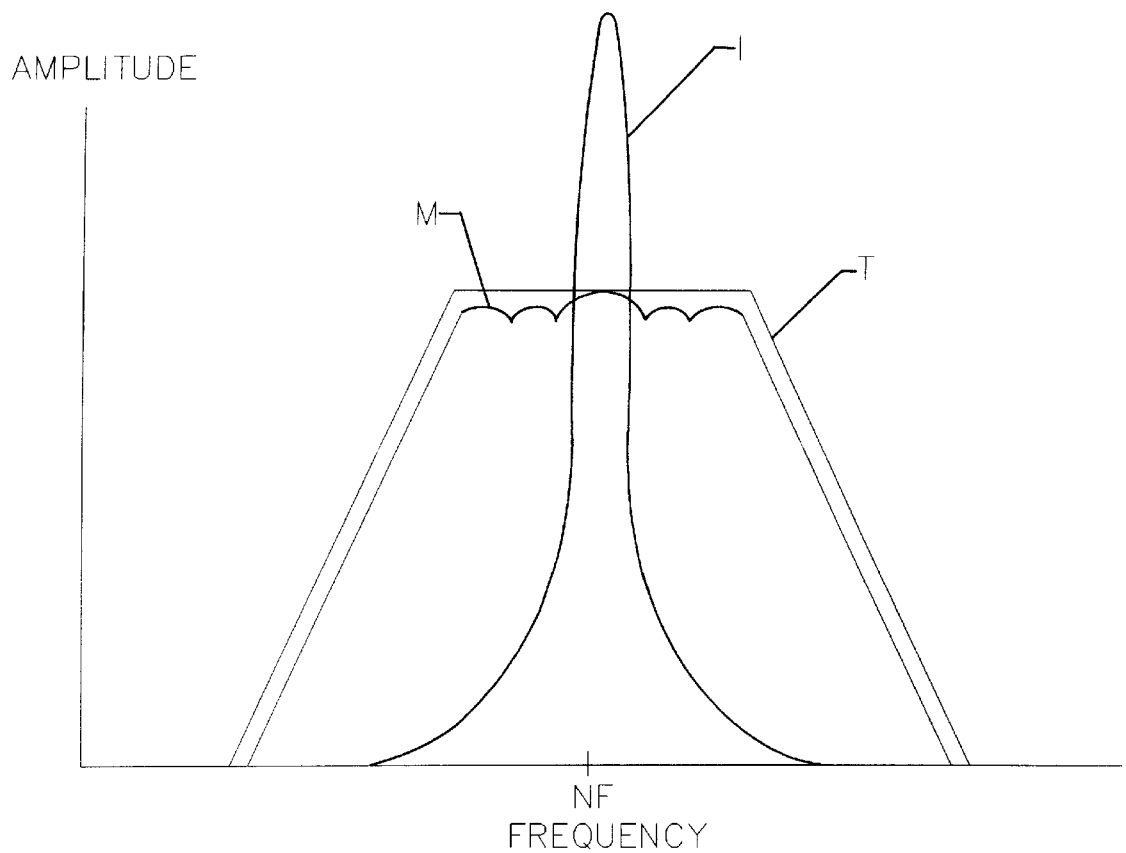
FIG. 2 is a graph illustrating a reduction of peak spectral amplitude of a harmonic of the clock fundamental frequency produced by the spread spectrum clock generating circuit in accordance with the present invention.

The SSCG 14 generates the spread spectrum output clock signal by frequency modulating a typical clock signal including a series of trapezoidal or generally rectangularly-shaped electrical clock pulses. The modulation reduces the spectral amplitude of the EMI components at each harmonic of the clock when compared to the spectrum of the same clocking signal without modulation. FIG. 2 is a schematic representation of this effect where the spectral amplitude versus frequency at a harmonic (NF) is indicated by the plot labelled M. As also shown, the spectrum at the same harmonic of a standard clock signal is given as an impulse function labelled I. The spectrum of the SSCG output clock signal at the same harmonic ideally assumes a trapezoidal shape as illustrated by the plot labelled T.

Although in general the spectral "width" of the spread spectrum output clock signal at a harmonic is greater than the width of the standard non-modulated clock signal, the maximum amplitude for the harmonic is reduced. In an actual implementation, the amplitude of the spread spectrum modulated harmonic will not be uniform, but will exhibit some peaking near the center frequency and at the edges as illustrated by the plot M.

In order to minimize the amplitude of the signal for all frequencies, the modulation of the standard clock signal must be uniquely specified. Accordingly, the SSCG 14 includes profile modulating means for frequency modulating the clock pulse generating means with a periodic waveform having a predetermined period and a predetermined frequency deviation profile as a function of the predetermined period. The modulation profiles described herein produce relatively optimized flat spectral amplitudes at each harmonic. In general, the preferred profiles are more complicated than a simple sine wave in order to thereby reduce the measurable spectral peaks of the EMI components. Stated in other terms, the present invention converts narrow band harmonics into broadband signals that significantly reduce the measured emissions for the FCC and other regulatory bodies worldwide. These emission reductions may permit corresponding cost reductions of about $20 or more per product, as compared to the cost of conventional measures to suppress or shield EMI emissions.

Figure 3:
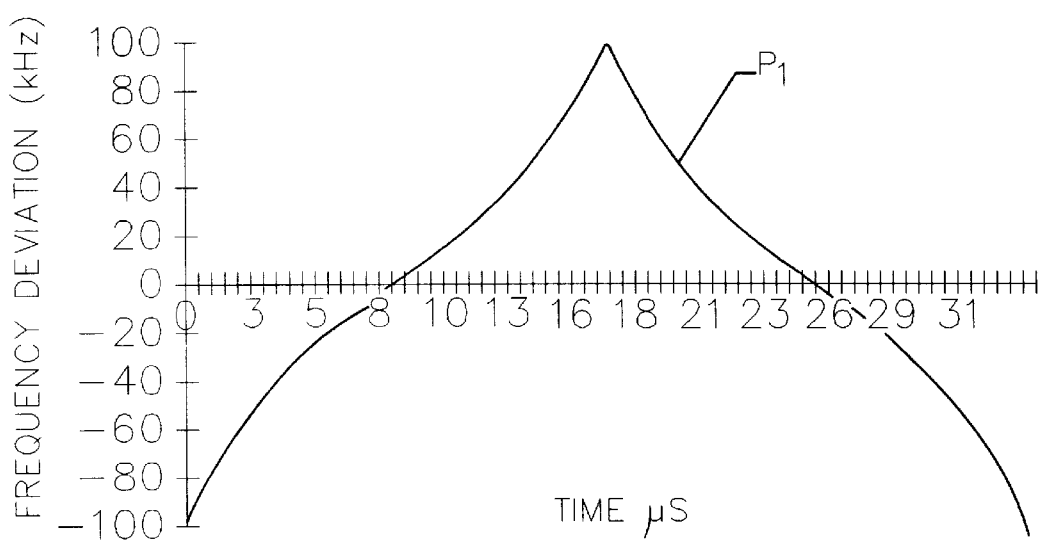
FIG. 3 is a graph illustrating an embodiment of a desired modulation profile for producing a spread spectrum modulated clock signal in accordance with the present invention.

FIG. 3 illustrates a typical profile of the frequency deviation versus time as may be used within the SSCG 14. The maximum deviation illustrated is 100 KKHz. This maximum frequency deviation is desirably programmable via a serial link with an upper limit of the maximum deviation being preferably about 250 KHz for typical current applications. However, depending on the application, the maximum deviation may be much greater than 250 KHz as would be readily understood by those skilled in the art. As would be also readily understood by those skilled in the art, a standard, non-modulated clock signal may be obtained by programming the maximum deviation to 0.

The frequency of the signal modulating the profile shown in FIG. 3 is 30 KHz. Significant peak amplitude reduction may also be achieved where the frequency is above 2 KHz, that is, where the period of the modulating waveform or profile is less than about 500 $\mu$sec. This frequency is also desirably programmable via the serial link or may be fixed dependent on the application. The modulating profile illustrated is a linear combination of a standard triangular wave and its cubic. The values of the profile are given in TABLE 1 below for maximum frequency deviations of 100 KHz and 200 KHz. For maximum deviations other than 100 KHz or 200 KHz, values for the modulating signal can be obtained by simply scaling the values found in TABLE 1 as would be readily appreciated by those skilled in the art.

TABLE 1

Frequency deviation values for maximum frequency deviations of 100 KHz and 200 KHz with a modulating frequency of 30 KHz.

| Time ($\mu$S) | Deviation (KHz) 100 KHz Maximum | Deviation (KHz) 200 KHz Maximum |
|---|---|---|
| 0 | −100 | −200 |
| 0.520833 | −88.4615 | −176.923 |
| 1.041667 | −76.9231 | −153.846 |
| 1.5625 | −67.3077 | −134.615 |
| 2.083333 | −59.6154 | −119.231 |
| 2.604167 | −51.9231 | −103.846 |
| 3.125 | −44.2308 | −88.4615 |

TABLE 1-continued

Frequency deviation values for maximum frequency deviations of 100 KHz and 200 KHz with a modulating frequency of 30 KHz.

| Time ($\mu$S) | Deviation (KHz) 100 KHz Maximum | Deviation (KHz) 200 KHz Maximum |
|---|---|---|
| 3.645833 | −38.4615 | −76.9231 |
| 4.166667 | −32.6923 | −65.3846 |
| 4.6875 | −26.9231 | −53.8462 |
| 5.208333 | −23.0769 | −46.1538 |
| 5.729167 | −19.2308 | −38.4615 |
| 6.25 | −13.4615 | −26.9231 |
| 6.770833 | −9.61538 | −19.2308 |
| 7.291667 | −7.69231 | −15.3846 |
| 7.8125 | −3.84615 | −7.69231 |
| 8.333333 | 0 | 0 |
| 8.854167 | 3.846154 | 7.692308 |
| 9.375 | 7.692308 | 15.38462 |
| 9.895833 | 9.615385 | 19.23077 |
| 10.41667 | 13.46154 | 26.92308 |
| 10.9375 | 19.23077 | 38.46154 |
| 11.45833 | 23.07692 | 46.15385 |
| 11.97917 | 26.92308 | 53.84615 |
| 12.5 | 32.69231 | 65.38462 |
| 13.02083 | 38.46154 | 76.92308 |
| 13.54167 | 44.23077 | 88.46154 |
| 14.0625 | 51.92308 | 103.8462 |
| 14.58333 | 59.61538 | 119.2308 |
| 15.10417 | 67.30769 | 134.6154 |
| 15.625 | 76.92308 | 153.8462 |
| 16.14583 | 88.46154 | 176.9231 |
| 16.66667 | 98.07692 | 196.1538 |
| 17.1875 | 88.46154 | 176.9231 |
| 17.70833 | 76.92308 | 153.8462 |
| 18.22917 | 67.30769 | 134.6154 |
| 18.75 | 59.61538 | 119.2308 |
| 19.27083 | 51.92308 | 103.8462 |
| 19.79167 | 44.23077 | 88.46154 |
| 20.3125 | 38.46154 | 76.92308 |
| 20.83333 | 32.69231 | 65.38462 |
| 21.35417 | 26.92308 | 53.84615 |
| 21.875 | 23.07692 | 46.15385 |
| 22.39583 | 19.23077 | 38.46154 |
| 22.91667 | 13.46154 | 26.92308 |
| 23.4375 | 9.615385 | 19.23077 |
| 23.95833 | 7.692308 | 15.38462 |
| 24.47917 | 3.846154 | 7.692308 |
| 25 | 0 | 0 |
| 25.52083 | −3.84615 | −7.69231 |
| 26.04167 | −7.69231 | −15.3846 |
| 26.5625 | −9.61538 | −19.2308 |
| 27.08333 | −13.4615 | −26.9231 |
| 27.60417 | −19.2308 | −38.4615 |
| 28.125 | −23.0769 | −46.1538 |
| 28.64583 | −26.9231 | −53.8462 |
| 29.16667 | −32.6923 | −65.3846 |
| 29.6875 | −38.4615 | −76.9231 |
| 30.20833 | −44.2308 | −88.4615 |
| 30.72917 | −51.9231 | −103.846 |
| 31.25 | −59.6154 | −119.231 |
| 31.77083 | −67.3077 | −134.615 |
| 32.29167 | −76.9231 | −153.846 |
| 32.8125 | −88.4615 | −176.923 |
| 33.33333 | −100 | −200 |

Figure 4:
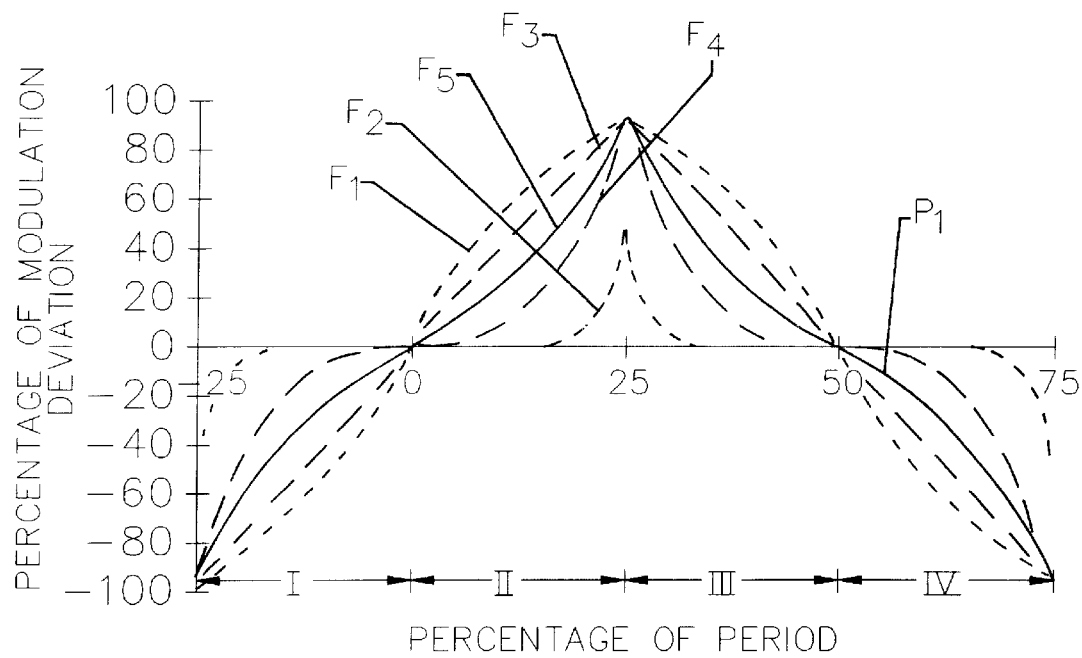
FIG. 4 is a graph illustrating several modulation profile ranges for producing a spread spectrum modulated clock output signal in accordance with the present invention.

Referring now more particularly to FIG. 4, several preferred ranges of profiles of frequency deviation are illustrated. In particular, the profiles are expressed as a percentage of frequency deviation versus a percentage of the period (% Period) of the periodic waveform. The outermost range or envelope is illustrated by the dotted lines labelled $F_1$, $F_2$ in the second quadrant II, that is, between 0% and 25% of the period. Straightforward symmetry defines the boundaries in the other indicated quadrants as described. Accordingly, those of skill in the art may readily implement and scale the ranges for a desired application.

The dotted lines may be defined mathematically by predetermined upper and lower bounds for the second quadrant II. The upper bound $F_1$ is defined by $$100\% \left[ -1 + \sqrt{-\left(\frac{\% \text{ Period}}{25}\right)^2 + 4\left(\frac{\% \text{ Period}}{25}\right) + .973} \right],$$

while the lower bound $F_2$ is defined by $$50\% \left[ \frac{\% \text{ Period}}{25} \right]^{10}.$$

As would be readily understood by those skilled in the art, the boundaries for the other quadrants defined by $F_1$ and $F_2$ as follows:
Quadrant I (−25% to 0% Period):
   Lower bound $= -F_1(-\%$ Period),
   Upper bound $= -F_2(-\%$ Period);
Quadrant III (25% to 50% Period):
   Lower bound $= F_2(50-\%$ Period),
   Upper bound $= F_1(50-\%$ Period); and
Quadrant IV (50% to 75% Period):
   Lower bound $= -F_1(\%$ Period$-50)$
   Upper bound $= -F_2(\%$ Period$-50)$.

A more preferred profile range is indicated by the dashed lines indicated in FIG. 4. In quadrant II, this profile is defined by an upper bound $F_3$ and a lower bound $F_4$. The upper bound $F_3$ is defined in quadrant II by $$100\% \left| \frac{\% \text{ Period}}{25} \right|,$$

and the lower bound is defined in quadrant II by $$100\% \left[ \frac{\% \text{ Period}}{25} \right]^3.$$

Accordingly, the other boundaries are given by:
Quadrant I (−25% to 0% Period):
   Lower bound $= -F_3(-\%$ Period),
   Upper bound $= -F_4(-\%$ Period);
Quadrant III (25% to 50% Period):
   Lower bound $= F_4(50-\%$ Period),
   Upper bound $= F_3(50-\%$ Period) ; and
Quadrant IV (50% to 75% Period):
   Lower bound $= -F_3(\%$ Period$-50)$
   Upper bound $= -F_4(\%$ Period$-50)$ As also shown in FIG. 2, the solid line $P_1$ of FIG. 4 illustrates the linear combination of a triangular waveform and its cubic. More particularly, this profile is defined in quadrant II by $F_5$ which is equal to $$100\%[0.45(\% \text{ Period}/25)^3 + 0.55(\% \text{ Period}/25)].$$

Accordingly, the solid line is defined in the other quadrants as follows:
Quadrant I (−25% to 0% Period):
   $-F_5(-\%$ Period);
Quadrant III (25% to 50% Period):
   $F_5(50-\%$ Period); and
Quadrant IV (50% to 75% Period):
   $-F_5(-$Period$-50)$
FIG. 5 illustrates yet another embodiment of a profile for the frequency deviation modulation which may be scaled to fit within the outermost profile defined by $F_1$ and $F_2$ as would be readily appreciated by those of skill in the art.

Figure 5:
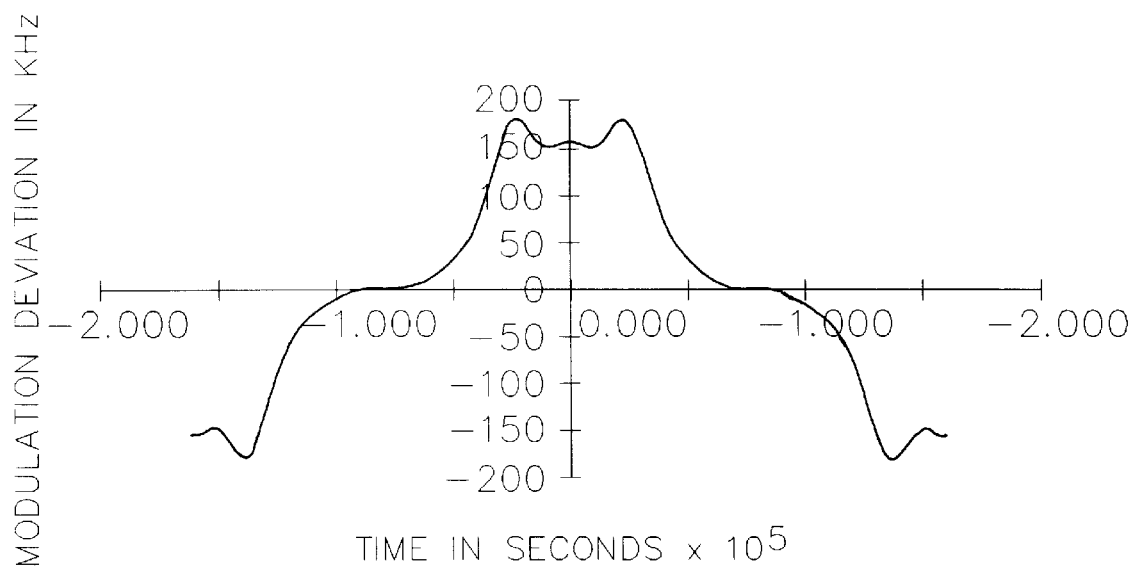
FIG. 5 is a graph illustrating yet another embodiment of a desired modulation profile for producing a spread spectrum modulated clock output signal in accordance with the present invention.

The periodic waveforms defined by $F_2$, $F_4$, $F_5$, and those less than $F_3$ illustrated in FIG. 4, and the waveforms of FIGS. 3 and 5 also may be described in terms of a function having predetermined concavity in each quadrant. More particularly, in view of the generally symmetric nature of a periodic waveform, the waveform may be defined in Quadrant I by a predetermined function which is generally negative, increasing and which defines a concave downward shape; in Quadrant II by a function which is generally positive, increasing and concave upward; in Quadrant III by a function which is generally positive, decreasing and concave upward; and, in Quadrant IV by a function which is generally negative, decreasing and concave downward.

Referring now additionally to FIGS. 6 through 9, preferred circuit embodiments for the SSCG 14 are described. The block diagrams are similar to several conventional phase locked loop (PLL) frequency synthesizer chips; however, a modulation section is added which includes a programmable modulation generator in several embodiments, or an analog modulation generator in other embodiments. The modulation is fed into a voltage controlled oscillator (VCO) or oscillator tank circuit to give the desired modulation index.

The SSCG 14 may desirably be programmable via an $I^2C$ serial bus or select lines to allow variation of the center frequency, maximum frequency deviation and modulation frequency. A single +5V supply, minimal external circuitry and a crystal will produce a TTL and CMOS compatible output with controlled rise and fall times. In addition, all inputs are standard TTL compatible.

The following electrical characteristics (TABLE 2) and switching characteristics (TABLE 3) given below are also desirably met by the embodiments of the SSCG 14 to be compatible with conventional digital circuits or microprocessors clock input requirements.

TABLE 2

Electrical Characteristics

| Characteristic | Symbol | Min | Typ | Max | Units |
|---|---|---|---|---|---|
| Load Capacitance | $C_L$ | — | 30 | 50 | pF |
| Quiescent Supply Current | $I_{CC}$ | — | — | 45 | mA |

TABLE 3

Switching Characteristics

| Characteristic | Symbol | Min | Typ | Max | Units |
|---|---|---|---|---|---|
| Output Rise (0.8 to 2.0V) and Fall Time (2.0V to 0.8V) | $t_{TLH}$, $t_{HL}$ | 1 | 2 | 3 | ns |
| Maximum Frequency Deviation* | $\Delta F_{max}$ | 0 | 100 | 250 | KHz |
| Modulating Frequency* | $F_{mod}$ | 15 | 30 | 50 | KHz |

*Programmable via serial link.

Figure 6:
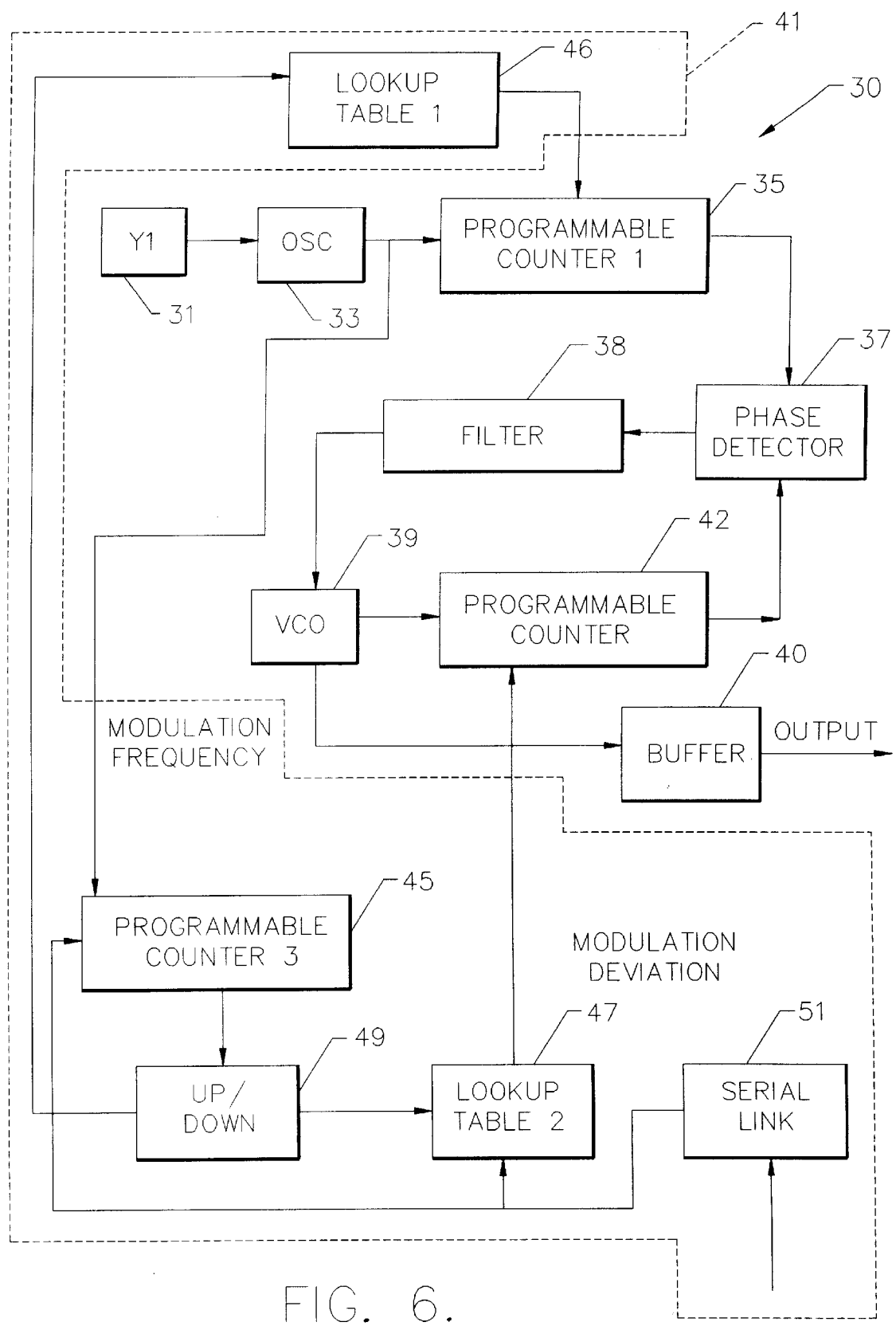
FIG. 6 is a schematic block diagram illustrating a first circuit embodiment for producing the spread spectrum modulated clock output signal in accordance with the present invention.

Referring first to the schematic block diagram of FIG. 6, a phase locked loop (PLL) implementation of the SSCG indicated generally by reference numeral 30 according to the invention is first explained. Y1 31 is a piezoelectric crystal used with an oscillator circuit 33 to generate a stable clock pulse train or unmodulated clock signal. A first programmable counter 35 divides the unmodulated clock signal by an integer number (M). A voltage controlled oscillator 39 (VCO) generates an output clock signal, output from a buffer 40, that is proportional to the input voltage from the phase detector 37 and filter 38.

A second programmable counter 42 divides the signal from the VCO 39 by an integer number (N). The phase detector 37 and filter 38 generate an analog signal that is proportional to the error in phase between first and second programmable counters 35, 42, respectively. Accordingly, the clock signal output from the buffer 40 is equal to the oscillator frequency times N/M. As would be readily understood by those skilled in the art, when N and M are constant, this circuit operates as a standard (PLL) circuit.

The spread spectrum modulation according to the invention is introduced in this embodiment by the spread spectrum modulation means 41 which changes M and N as a function of time. A third programmable counter 45 divides the signal from the oscillator 33 by an integer number (I) which sets the rate that M and N change, or modulation frequency. First and second look-up tables 46, 47, respectively, are the stabilized values for M and N which modulate the output clock signal frequency. An up/down counter 49 is used to index successive entries in the look-up tables. A serial link 51, which is not required for operation, may be used to program different values in the programmable counters or look-up tables to modify modulation characteristics.

Figure 7:
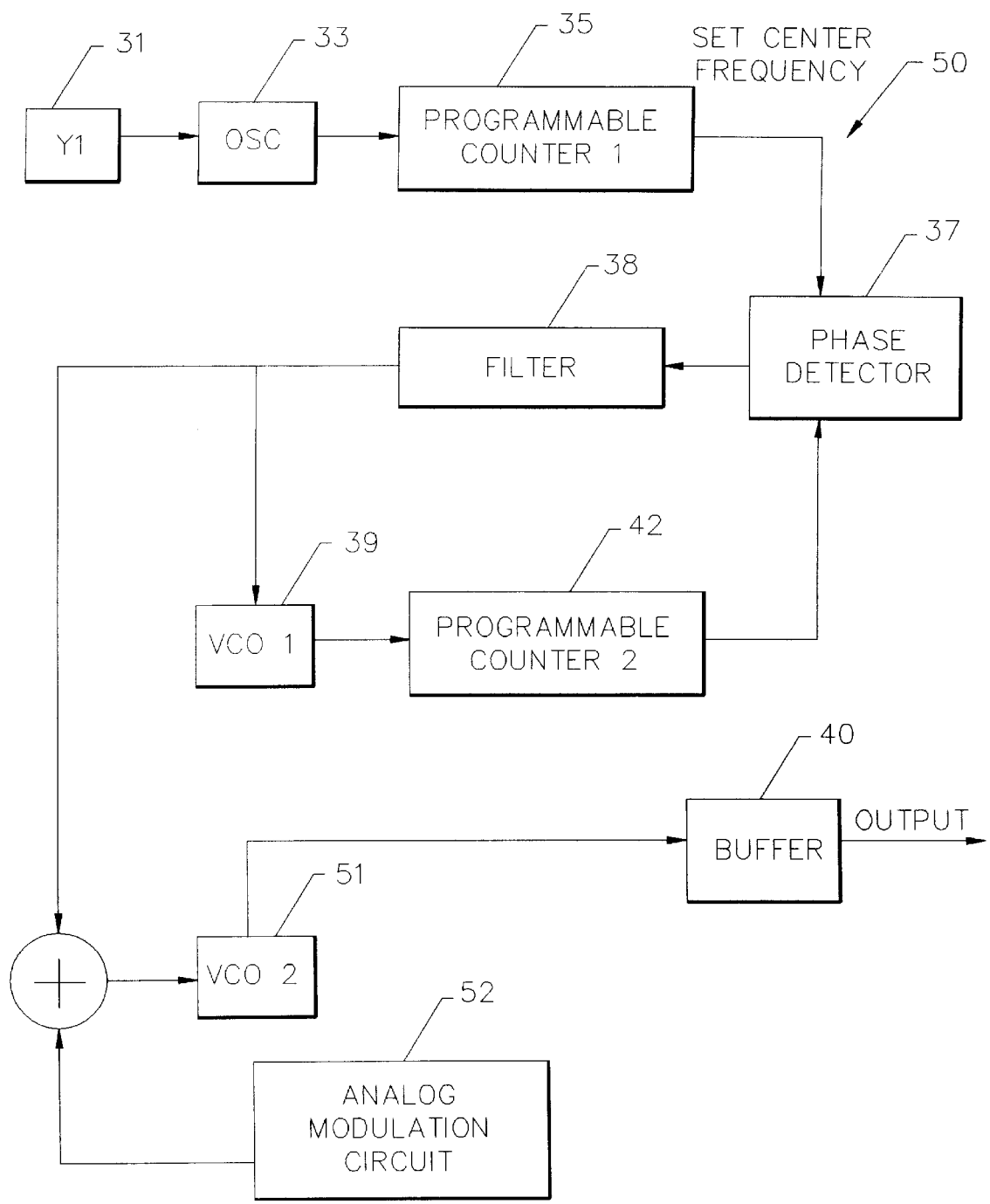
FIG. 7 is a schematic block diagram illustrating a second circuit embodiment for producing the spread spectrum modulated clock output signal in accordance with the present invention.

Referring now to FIG. 7, a second embodiment of the SSCG generally designated by reference numeral 50 is described. Elements previously discussed are indicated by like numerals and need not be described further. In this embodiment, the spread spectrum modulation is introduced by a second VCO 51 and an analog circuit 52. The second VCO creates a clock signal identical to the first VCO 39 when no modulation is present. The second VCO 51 responds to the analog modulation to thereby create the spread spectrum clock output signal.

An embodiment of the analog modulation circuit 52 may include an oscillator to generate the modulation frequency, an integrator to generate a triangle wave function (r(t)), a log anti-log amplifier (alog(3log(r(t)))), and an adder to generate a modulation profile of 0.55r(t)+0.45(alog(3log(r(t)))) as shown by plot P1 in FIG. 3. An alternative of the illustrated embodiment would be to add the modulation to the first VCO 39 input, as would be readily understood by those skilled in the art.

Figure 8:
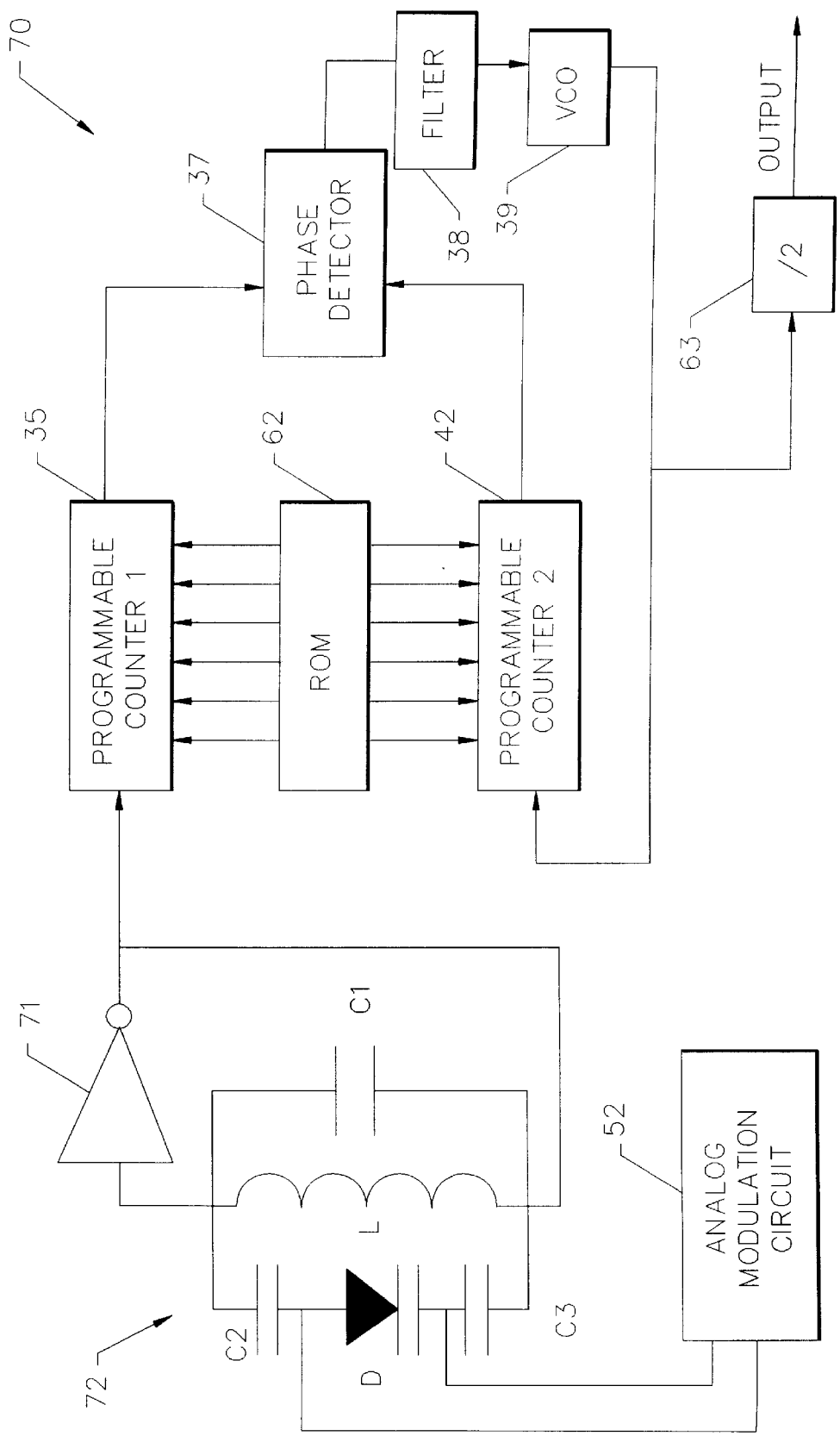
FIG. 8 is a schematic block diagram illustrating a third circuit embodiment for producing the spread spectrum modulated clock output signal in accordance with the present invention.

FIG. 8 illustrates yet another embodiment of the SSCG 70 according to the invention. An inverting amplifier 71 with an inductor L and a capacitor C1 forms a simple oscillator circuit 72 to generate a stable clock signal. Capacitors C1, C3 and varactor diode D are used to change the effective capacitance of C1 which will thereby change the oscillator circuit frequency. The varactor diode changes its junction capacitance proportional to the voltage applied thereacross. The analog modulation circuit 52 is preferably the same as discussed above with reference to FIG. 7. The output of the inverting amplifier 71 is a spread spectrum clock signal that can be used directly or that may also be scaled to any other frequency by adding a PLL circuit as illustrated. A first programmable counter 35 divides the oscillator signal by an integer number (M), while the VCO 39 generates a clock signal proportional to the input voltage from the phase detector 37 and filter 38. The second programmable counter 42 divides the VCO signal by an integer number (N). The phase detector 37 and filter 38 output an analog signal that is proportional to the error in phase between the first and second programmable counters 35, 42, respectively. The divide by 2 circuit 63 may be used to generate a clock output signal having a 50% duty cycle as would be readily understood by those skilled in the art.

Figure 9:
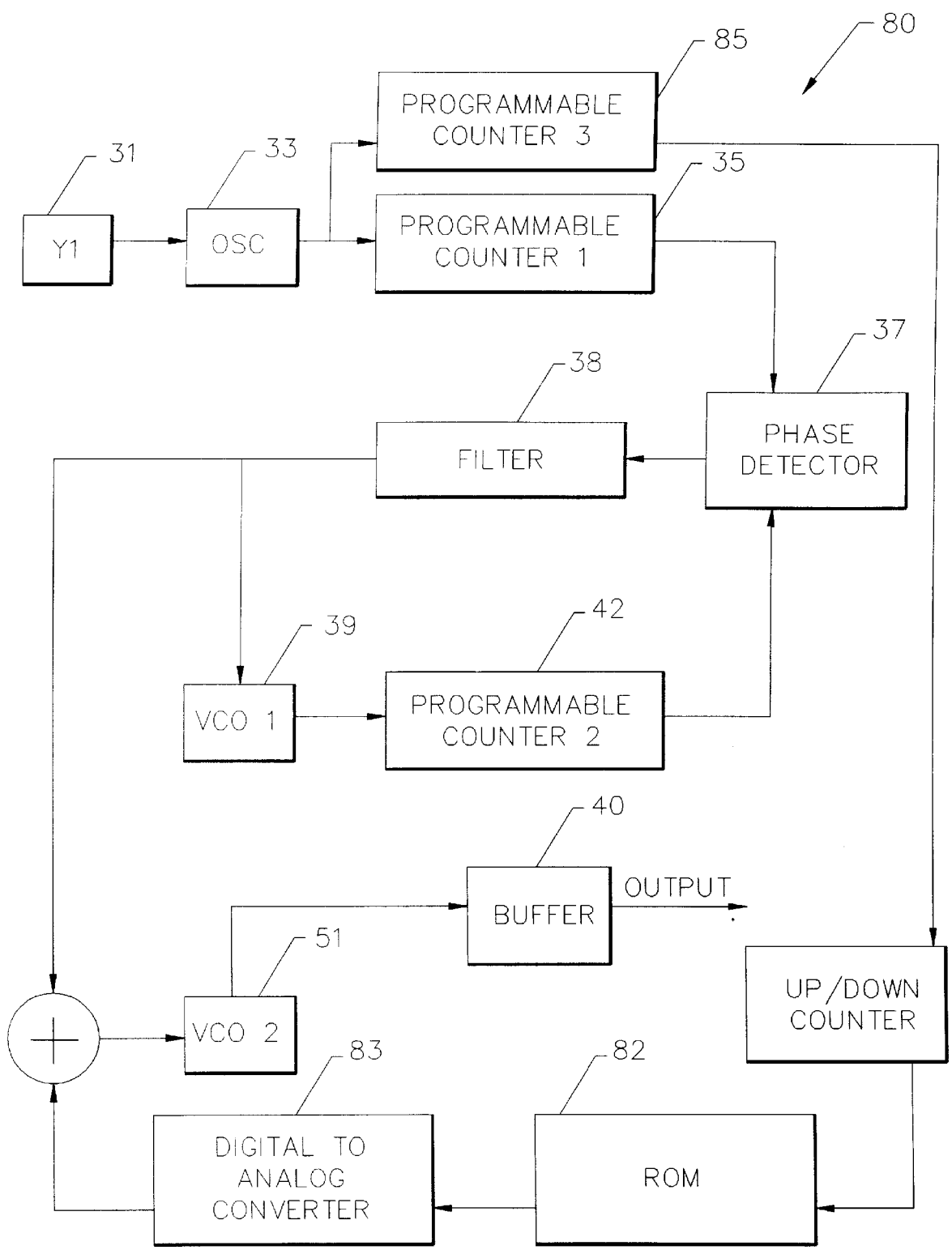
FIG. 9 is a schematic block diagram illustrating a fourth circuit embodiment for producing the spread spectrum modulated clock output signal in accordance with the present invention.

Still another embodiment of an SSCG 80 is illustrated in FIG. 9 and is described as follows. The illustrated embodiment is similar to that shown in FIG. 7, but the modulation is created by a ROM 82 having stored therein modulation amplitude values that are fed into a digital to analog convertor 83 (DAC). An up/down counter 84 is used to index the values in the ROM 82 while a third programmable counter 85 sets the modulation frequency.

Another embodiment of an SSCG may include a direct digital synthesizer. A crystal and oscillator circuit generate a stable or unmodulated clock signal. As would be readily understood by those skilled in the art, the direct digital synthesizer (DDS) is an accumulator with a phase constant added to the accumulator every clock cycle and which in conjunction with a read only memory (ROM) produces a square wave from the Most Significant Bit (MSB). The frequency of an output square wave can be modulated by changing the phase constant as a function of time. This is preferably accomplished using a programmable up/down counter, and a look-up table similar to those illustrated in FIG. 6. A VCO generates a clock signal proportional to the input voltage from a phase detector and filter. A programmable counter divides the VCO signal by an integer number (N). The phase detector and filter also output an analog signal that is proportional to the error in phase between programmable counter and the DDS circuit. The spread spectrum modulated clock signal may be output from a divider or buffer.

As would be readily understood by those skilled in the art, in an implementation of any of the circuits described herein in a physical package, several such spread spectrum clock generating circuits (SSCG's) may be found in the same DIP. In addition, a standard phase locked loop frequency synthesizer may also be located in the same DIP to provide standard clock signals, if desired. The SSCG may also be included internally with a microprocessor or any other digital or analog circuit.

A method according to the invention is for generating the spread spectrum clock output signal. The method preferably includes the steps of: generating a series of clock pulses, and spread spectrum modulating the series of clock pulses to broaden and flatten amplitudes of EMI spectral components which would otherwise be produced along with the series of clock pulses. The step of spread spectrum modulating the series of clock pulses preferably includes the step of frequency modulating the clock pulses with a periodic waveform having a predetermined period and a predetermined frequency deviation profile as a function of the predetermined period, as described in greater detail above.

The step of frequency modulating the series of clock pulses preferably includes modulating the series of clock pulses with a periodic waveform having a period of less than about 500 microseconds. The spread spectrum modulation according to the invention causes varying of the clock fundamental frequency, which in turn, may result in a 5–10% reduction in average clock frequency compared to the fixed frequency of a conventional clock circuit. However, for a significant number of applications, the SSCG according to the invention significantly reduces measured EMI emissions without adversely affecting overall electronic device performance.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A clock circuit for generating a clock output signal with reduced amplitude electromagnetic interference (EMI) spectral components, said clock circuit comprising:

oscillator means for generating a reference frequency signal; and spread spectrum clock generating means cooperating with said oscillator means for generating a spread spectrum clock output signal having a fundamental frequency and reduced amplitude EMI spectral components at harmonics of the fundamental frequency, said spread spectrum clock generating means comprising clock pulse generating means for generating a series of generally rectangularly shaped electrical clock pulses; and spread spectrum modulating means cooperating with said clock pulse generating means for modulating same to broaden and flatten amplitudes of impulse-shaped EMI spectral components which would otherwise be produced by said clock pulse generating means, said spread spectrum modulating means comprising frequency modulating means for frequency modulating said clock pulse generating means, said frequency modulating means comprising profile modulating means for modulating the clock pulse generating means with a periodic waveform having a percentage of frequency deviation profile as a function of percentage of a period (% Period) of the periodic waveform defined in a second quadrant by $F_5$ which is defined as a function generally as follows:

100% $(0.45(\%\ Period/25)^3+0.55(\%\ Period/25))$;

wherein for a first quadrant between −25% to 0% Period the profile is equal to $-F_5(-\%\ Period)$;

wherein for a third quadrant between 25% to 50% Period the profile is equal to $F_5(50-\%\ Period)$; and wherein for a fourth quadrant the profile is equal to $-F_5(\%\ Period-50)$.

2. A clock circuit for generating a clock output signal with reduced amplitude electromagnetic interference (EMI) spectral components, said clock circuit comprising:

oscillator means for generating a reference frequency signal; and spread spectrum clock generating means cooperating with said oscillator means for generating a spread spectrum clock output signal having a fundamental frequency and reduced amplitude EMI spectral components at harmonics of the fundamental frequency, said spread spectrum clock generating means comprising clock pulse generating means for generating a series of clock pulses, and profile modulating means for frequency modulating the clock pulse generating means with a periodic waveform having a percentage of frequency deviation profile as a function of percentage of a period (% Period) of the periodic waveform defined in a second quadrant by $F_5$ which is defined by function generally as follows:

100%$(0.45(\%\ Period/25)^3+0.55(\%\ Period/25))$;

wherein for a first quadrant between −25% to 0% Period the profile is equal to $-F_5(-\%\ Period)$;

wherein for a third quadrant between 25% to 50% Period the profile is equal to $F_5(50-\%\ Period)$; and wherein for a fourth quadrant the profile is equal to $-F_5(\%\ Period-50)$.

3. A clock circuit for generating a clock output signal with reduced amplitude electromagnetic interference (EMI) spectral components, said clock circuit comprising:

clock pulse generating means for generating a series of clock pulses; and spread spectrum modulating means cooperating with said clock pulse generating means for modulating same to broaden and flatten amplitudes of EMI spectral components which would otherwise be produced by said clock pulse generating means, said spread spectrum modulating means comprising frequency modulating means for frequency modulating said clock pulse generating means, said frequency modulating means comprising profile modulating means for modulating the clock pulse generating means with a periodic waveform having a percentage of frequency deviation profile as a function of percentage of a period (% Period) of the periodic waveform defined in a second quadrant by $F_5$ which is defined by a function is generally as follows:

100%$(0.45(\%\ Period/25)^3+0.55(\%\ Period/25))$;

wherein for a first quadrant between −25% to 0% Period the profile is equal to $-F_5(-\%\ Period)$;

wherein for a third quadrant between 25% to 50% Period the profile is equal to $F_5(50-\%\ Period)$; and wherein for a fourth quadrant the profile is equal to $-F_5(\%\ Period\ -50)$.

4. An electronic device having reduced amplitude electromagnetic interference (EMI) spectral components, said electronic device comprising:

spread spectrum clock generating means for generating a spread spectrum clock output signal having a fundamental frequency and reduced amplitude EMI spectral components at harmonics of the fundamental frequency, said spread spectrum clock generating means comprising profile modulating means for frequency modulating a series of clock pulses with a periodic waveform having a percentage of frequency deviation profile as a function of percentage of a period (% Period) of the periodic waveform defined in a second quadrant by $F_5$ which is defined by a function generally as follows:

100%$(0.45(\%\ Period/25)^3+0.55\%(\%\ Period/25))$;

wherein for a first quadrant between −25% to 0% Period the profile is equal to $-F_5(-\%\ Period)$;

wherein for a third quadrant between 25% to 50% Period the profile is equal to $F_5(50-\%\ Period)$; and wherein for a fourth quadrant the profile is equal to $-F_5(\%\ Period\ -50)$;

said spread spectrum clock generating means comprising:

clock pulse generating means for generating a series of clock pulses; and spread spectrum modulating means cooperating with said clock pulse generating means for modulating same to broaden and flatten amplitudes of EMI spectral components which would otherwise be produced by said clock pulse generating means; and a digital circuit connected to said spread spectrum clock generating means and having a clock input driven by the spread spectrum clock output signal.

* * * * *